United States Patent [19]
Mueller

[11] Patent Number: 5,851,858
[45] Date of Patent: *Dec. 22, 1998

[54] METHOD FOR PRODUCING A MULTIPLICITY OF MICROELECTRONIC CIRCUITS ON SOI

[75] Inventor: Karlheinz Mueller, Waldkraiburg, Germany

[73] Assignee: Siemens Aktiengesellschaft, Munich, Germany

[ * ] Notice: The term of this patent shall not extend beyond the expiration date of Pat. No. 5,733,803.

[21] Appl. No.: 723,846

[22] Filed: Sep. 30, 1996

[30] Foreign Application Priority Data

Sep. 28, 1995 [DE] Germany .................. 195 36 262.4

[51] Int. Cl.$^6$ .................. H01L 21/00; H01L 21/336
[52] U.S. Cl. .................. 438/154; 438/300; 438/368
[58] Field of Search .................. 438/155, 157, 438/154, 300, 368

[56] References Cited

U.S. PATENT DOCUMENTS

| | | | |
|---|---|---|---|
| 4,276,688 | 7/1981 | Hsu | 29/571 |
| 5,164,326 | 11/1992 | Foerstner | 437/34 |
| 5,389,561 | 2/1995 | Gomi | 437/31 |
| 5,545,579 | 8/1996 | Liang | 437/44 |

*Primary Examiner*—John Niebling
*Assistant Examiner*—Michael S. Lebentritt
*Attorney, Agent, or Firm*—Herbert L. Lerner; Laurence A. Greenberg

[57] ABSTRACT

A method for producing a multiplicity of microelectronic circuits on SOI produces n-CMOS or p-CMOS transistors, NPN transistors or PNP transistors, for instance, through the use of a standardized process, in an especially simple way. All that is required to do so is to adapt the implantations that are performed.

12 Claims, 3 Drawing Sheets

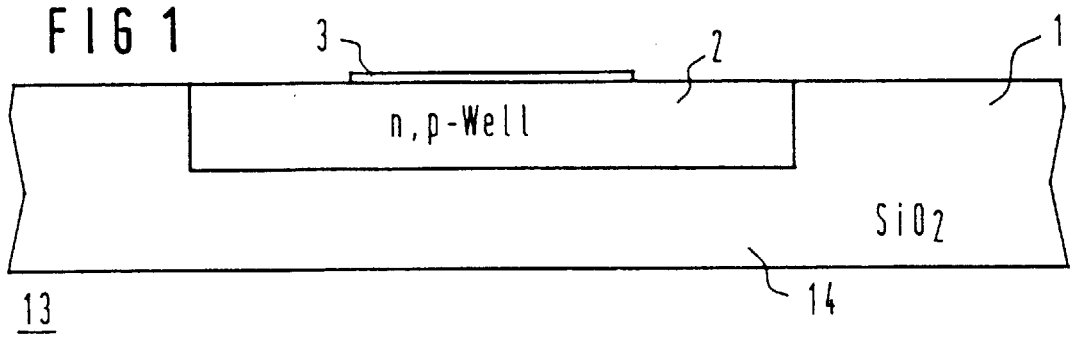
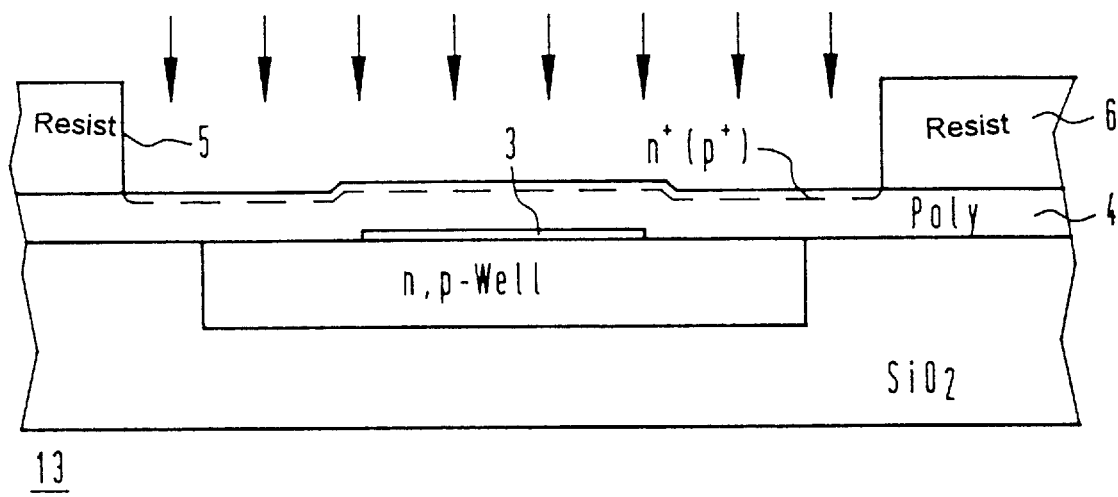
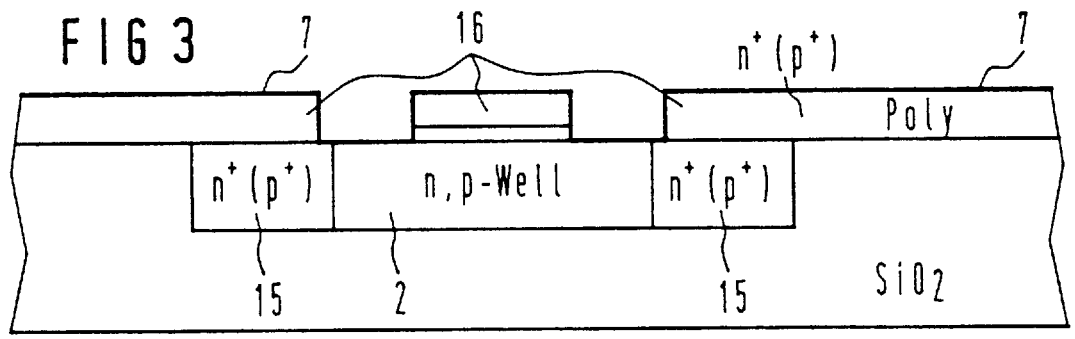

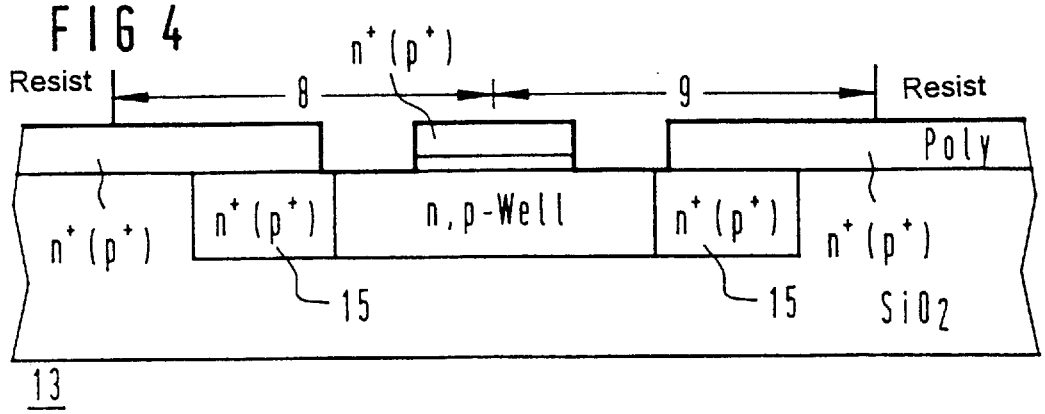
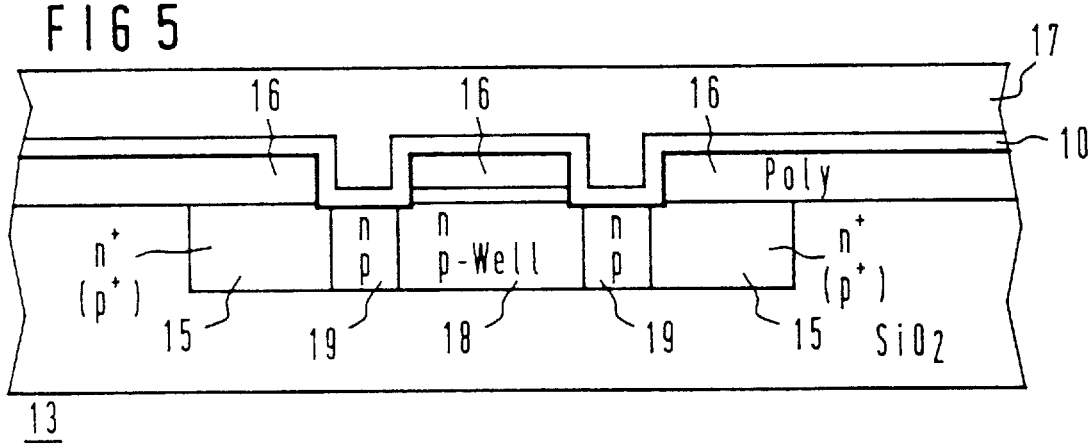
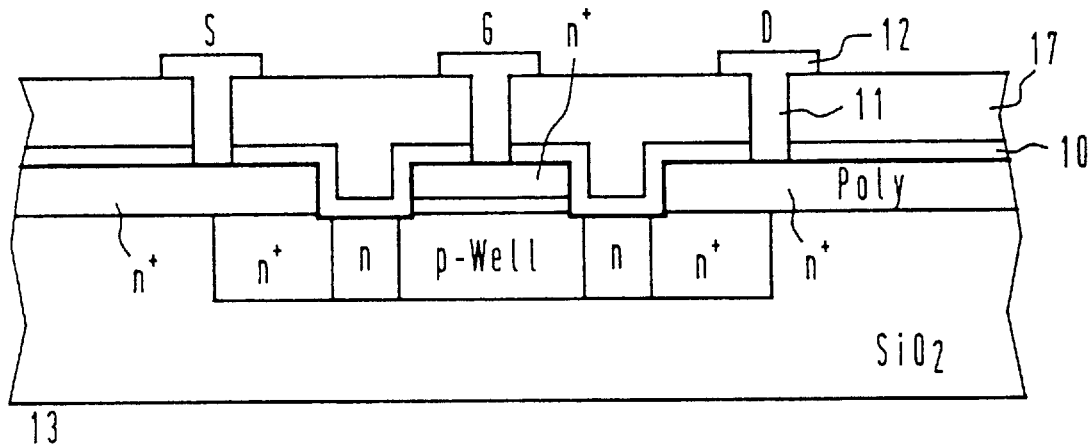

METHOD FOR PRODUCING A MULTIPLICITY OF MICROELECTRONIC CIRCUITS ON SOI

BACKGROUND OF THE INVENTION

FIELD OF THE INVENTION

The invention relates to a method for producing a multiplicity of microelectronic circuits on SOI. In particular, CMOS transistors and/or bipolar transistors are produced.

A number of different methods are known with which microelectronic circuits, including CMOS transistors or bipolar transistors, can be produced. However, the methods differ considerably from one another and cannot be combined with one another, or can be so combined only with major effort.

SUMMARY OF THE INVENTION

It is accordingly an object of the invention to provide a method for producing a multiplicity of different microelectronic structures on SOI and especially CMOS structures and bipolar transistors, which overcomes the hereinaforementioned disadvantages of the heretofore-known methods of this general type.

With the foregoing and other objects in view there is provided, in accordance with the invention, a method for producing a multiplicity of microelectronic circuits on SOI, in particular CMOS transistors and bipolar transistors, which comprises defining a multiplicity of active regions in an insulator material; implanting an n-well or a p-well in each of the active regions, depending on the structure to be created; creating and defining a gate oxide in partial regions of the active region; applying a polysilicon layer; $n^+$ or $p^+$ doping a region of the polysilicon layer located above the well, depending on the structure to be created, and later diffusing the dopant in a lateral region of the well; etching the polysilicon layer to define active regions; performing an oxidation of the polysilicon layer and of the active regions previously etched bare, to form an oxide layer; performing a $p^-$ or $n^-$ implantation for forming a base, or LDD implantation, depending on the structure to be created; diffusing implanted dopants into underlying well regions with a temperature treatment; applying an oxide layer; and performing contacting.

The method of the invention provides an especially simple possibility of defining a multiplicity of active regions on one wafer, and by using the same process block, of producing a multiplicity of different structures, where only the implantations that are carried out have to be adapted. In this especially simple method, only one polysilicon layer is used.

In accordance with another mode of the invention, in order to produce an n-CMOS structure, a p-well is first implanted, an $n^+$ source/drain implantation and in a concluding implantation step an $n^-$ LDD implantation on both sides, are carried out.

In accordance with a further mode of the invention, in the production of a p-CMOS structure, an n-well is first implanted, and then a $p^+$ source/drain implantation and in conclusion a $p^-$ LDD implantation on both sides, is carried out.

In accordance with an added feature of the invention, in order to produce an NPN transistor, first an n-well is implanted, and then an $n^+$ implantation, to produce emitter and collector regions, and later a $p^-$ implantation on one side is performed to create a base.

In accordance with an additional feature of the invention, in order to produce a PNP transistor, a p-well is first created, with ensuing $p^-$ doping emitter and collector regions are created, and with an $n^-$ implantation a base is produced.

In accordance with yet another mode of the invention, a multiplicity of identical structures are created on one wafer.

In this way, a multiplicity of microelectronic components can be created in one process sequence. Naturally, it is equally possible to produce different structures on one wafer. To that end, various implantations must be performed within the process standardized according to the invention.

Through the use of the method of the invention, a low cost BiCMOS process on SOI is achieved, in which only one polysilicon layer is used for the gate, source and drain in the production of CMOS transistors, or for the emitter and collector in the production of bipolar transistors.

In accordance with yet a further mode of the invention, in order to produce the electrical contacts, a boron phosphorus silicate glass (BPSG) coating is applied on the most recently applied oxide layer, and contact holes are etched through this BPSG layer down to the underlying polysilicon structures. The metal contacts are then passed through these contact holes.

In accordance with yet an added feature of the invention, after each implantation step, a curing process can be performed, in order to activate the dopants and assure diffusion of the dopants into the regions of the monocrystalline silicon of the well. It is preferably to perform only a single curing step, which is performed after the final implantation and simultaneously assures the diffusion of all of the implanted dopants.

Other features which are considered as characteristic for the invention are set forth in the appended claims.

Although the invention is illustrated and described herein as embodied in a method for producing a multiplicity of microelectronic circuits on SOI, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–5 are fragmentary, diagrammatic, cross-sectional views showing various stages of the method during the course of the process;

FIG. 6 is a fragmentary, cross-sectional view of an n-CMOS transistor produced by the method of the invention;

DESCRIPTION OF THE PREFERRED EMBODIMENTS

Figure 7:
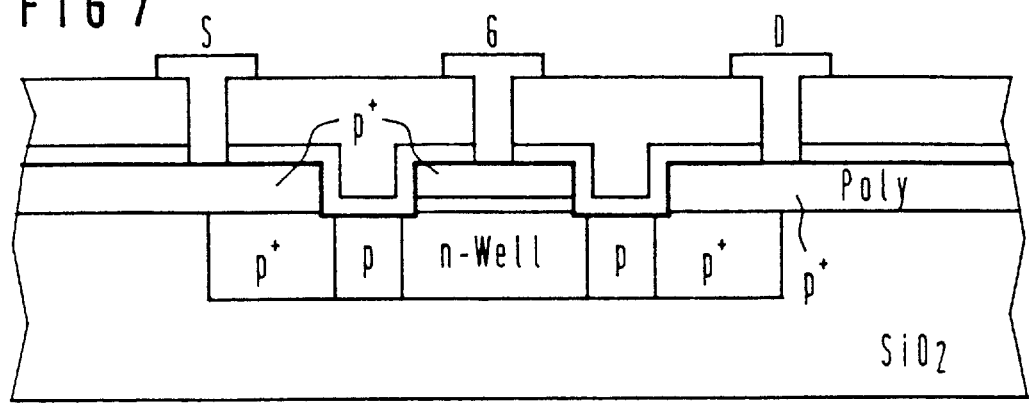
FIG. 7 is a fragmentary, cross-sectional view of a p-CMOS transistor produced by the method of the invention.

Referring now to the figures of the drawings in detail and first, particularly, to FIG. 1 thereof, it is seen that at the beginning of the method, a silicon dioxide layer ($SiO_2$) 14 and a silicon layer over it are applied to a substrate 13. Active regions 1 are defined by mesa etching or oxidation in the silicon layer. This is the way in which the active region 1 shown in FIG. 1 comes about. On the wafer that is used, a multiplicity of active regions 1 are defined, in each of which one of the structures described below is created. For the sake of simpler illustration, the drawings each show only one active region 1. The regions outside the active regions 1 are covered with a mask technique, and in the active regions 1 an n-tub 2 or p-tub 2 is created by an ion implantation. These tubs are also known as wells and are formed of monosilicon. A selection of the dopant that is used depends on the structure to be created. In order to provide an n-CMOS or a PNP-transistor, a p-well is created, while in order to provide a p-CMOS or an NPN-transistor, an n-well is created. The thus-implanted well 2 is cured by temperature treatment. Next, a gate oxide 3 is applied, structured with a further mask technique, and $SiO_2$ etched, so that the gate oxide 3 covers only a portion of the active regions 1.

In the next steps, shown in FIG. 2, a first polysilicon layer 4 is applied over the entire surface. In this polysilicon layer 4, high-impedance resistors can be created by $n^-$ or p-implantations. They serve to join and further connect the structures created. A resist mask having regions 5 and 6 is also applied, and with it an $n^+$ or a $p^+$ implantation is performed. In the production of CMOS structures, these implantations serve the purpose of source/drain implantation, and when transistors are produced, they serve to produce emitters and collectors. Moreover, a base terminal for the PNP-transistor, or capacitors and resistors, can be created with the $n^+$ implantation. Conversely, with the $n^-$ implantation, a base terminal for the NPN-transistor or capacitors and resistors can be created.

In FIG. 3, $n^+$ or $p^+$ doped outer regions 15 in the well 2 are shown. They are created by a curing process, performed by a temperature treatment, in which the dopants implanted in the polysilicon layer 4 diffuse into the underlying regions of the well 2. The gate oxide 3 acts as a diffusion stop in this central region of the well 2, so that no dopants can diffuse into that region. Moreover, active regions 16 are created by etching of the polysilicon layer 4. The etching also removes the gate oxide 3 present in this region and extends as far as the underlying well 2. Next, an oxidation is performed, in which an oxide layer 7 is created both in the region of the polysilicon layer 4 and on the side walls, that were previously etched bare, of the active regions 16 and the well regions which were previously etched bare.

The next steps are shown in FIG. 4. A resist mask 8, 9 is applied, with the aid of which a $p^-$ or $n^-$ ion implantation is carried out, so that after a curing process, additional structures, shown in FIG. 5, have been created in the well. The increased temperature in the curing process leads to a diffusion of the dopants out of the polysilicon into the monosilicon regions of the well 2. The thus-created additional structures are located in an intermediate region 19 of the well, between a central region 18 of the well and the previously created $n^+$ or $p^+$ doped outer regions 19. With the $p^-$ ion implantation, the base can be created in the NPN-transistor, or an LDD-implantation can be carried out in the p-CMOS transistor. Analogously, with the $n^-$ ion implantation, the base of the PNP-transistor would be created, or in the n-CMOS transistor an LDD-implantation would be performed.

As was already described above, the regions 19 created in the preceding curing process are shown in FIG. 5. An oxide layer 10 is applied onto the structure created up to this point. The course of the oxide layer 10 follows the previously created structure in the active regions 16. A relatively thick boron phosphorous silicate glass (PBSG) layer 17, which serves to provide further protection for the circuit located under it, is applied over the oxide layer 10.

By way of example, FIG. 6 shows how contact holes 11 can be formed through the PBSG layer 17. These holes are formed down to the active regions of the polysilicon layer 4. Metal contacts 12 for connection to the circuit are placed through the etched contact holes 11.

Figure 8:
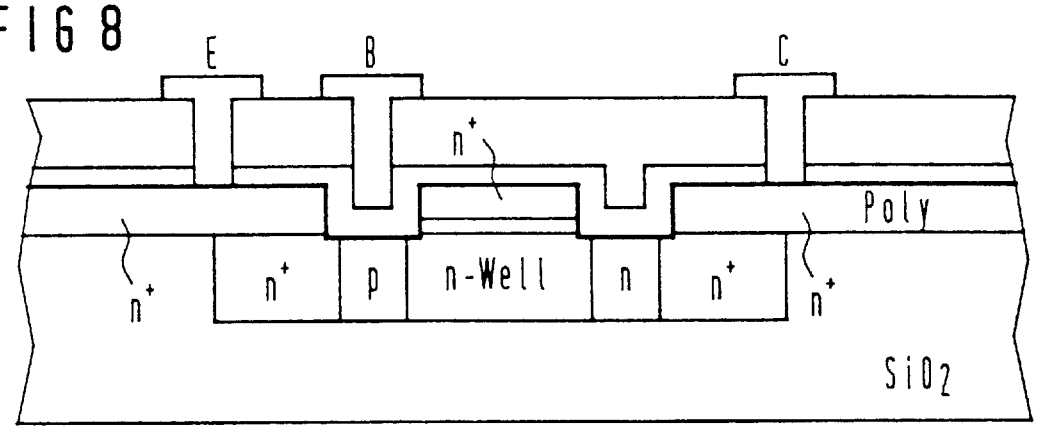
FIG. 8 is a fragmentary, cross-sectional view of an npn transistor produced by the method of the invention.
Figure 9:
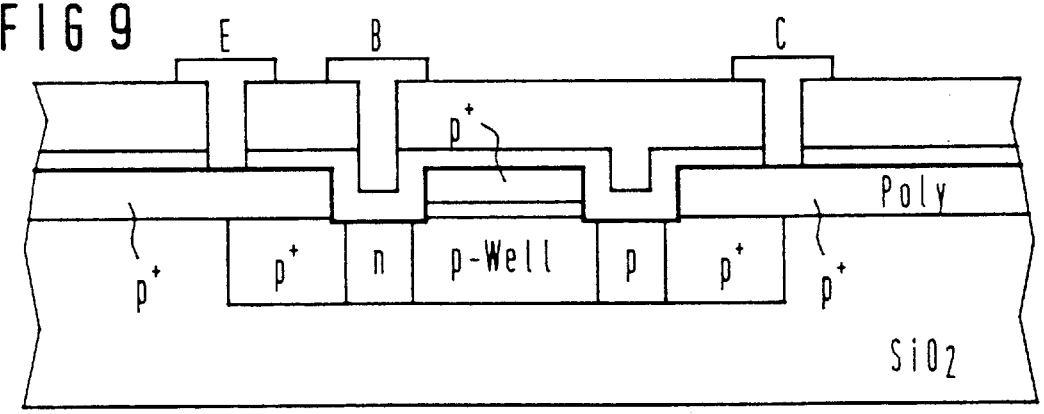
FIG. 9 is a fragmentary, cross-sectional view of a pnp transistor produced by the method of the invention.

Structures that can be produced by this method are shown in FIGS. 6–9. FIG. 6 shows an n-CMOS transistor, FIG. 7 a p-CMOS transistor, FIG. 8 an NPN-transistor, and FIG. 9 a PNP-transistor. In the drawings, reference symbol S stands for source, D for drain and G for gate. The letters E, B and C in the transistors stand for emitter, base and collector.

I claim:

1. A method for producing a multiplicity of microelectronic circuits on silicon on insulator substrate, which comprises:

defining a multiplicity of active regions in an insulator material;

implanting an n-well or a p-well in each of the active regions, depending on a structure to be created;

creating and defining a gate oxide layer in partial regions of the active region;

applying a polysilicon layer;

$n^+$ or $p^+$ doping a region of the polysilicon layer located above the well, depending on the structure to be created;

etching the polysilicon layer for exposing portions of the active regions;

performing an oxidation of the polysilicon layer and of the active regions previously etched bare, to form a second oxide layer;

performing a $p^-$ or $n^-$ implantation, depending on the structure to be created;

diffusing implanted dopants into underlying well regions;

applying a third oxide layer; and performing contacting.

2. The method according to claim 1, which comprises producing an n-CMOS structure by first implanting a p-well, then performing an $n^+$ source/drain implantation, and then performing an $n^-$ LDD implantation on both sides of the p-well not covered by the gate oxide layer.

3. The method according to claim 1, which comprises producing a p-CMOS structure by first implanting an n-well, then performing an $p^+$ source/drain implantation, and then performing an $p^-$ LDD implantation on both sides of the n-well not covered by the gate oxide layer.

4. The method according to claim 1, which comprises producing an NPN transistor by first implanting an n-well, then performing an $n^+$ implantation to produce emitter and collector regions and then performing a $p^-$ implantation on one side of the n-well to create a base.

5. The method according to claim 1, which comprises producing an pnp transistor by first doping a p-well, then performing a $p^+$ implantation to produce emitter and collector regions and then performing an $n^-$ doping on one side of the p-well to create a base.

6. The method according to claim 1, which comprises creating identical structures.

7. The method according to claim 1, which comprises creating structures with only one polysilicon layer.

8. The method according to claim 1, which comprises performing the contacting step by applying a BPSG coating on the third oxide layer, etching contact holes, and placing metal contacts in the contact holes for contacting the polysilicon layer.

9. The method according to claim 1, which comprises performing a curing process after a final implantation is carried out.

10. The method according to claim 1, which comprises producing CMOS transistors and bipolar transistors on the insulator material.

11. The method according to claim 1, which comprises producing CMOS transistors on the insulator material.

12. The method according to claim 1, which comprises producing bipolar transistors on the insulator material.

* * * * *